United States Patent [19]
Sato

[11] Patent Number: 5,993,547
[45] Date of Patent: Nov. 30, 1999

[54] EDGE RINSE MECHANISM FOR REMOVING A PERIPHERAL PORTION OF A RESIST FILM FORMED ON A WAFER

[75] Inventor: Hiroshi Sato, Yamagata, Japan

[73] Assignee: NEC Corporation, Tokyo, Japan

[21] Appl. No.: 09/005,131

[22] Filed: Jan. 9, 1998

[30] Foreign Application Priority Data

Jan. 9, 1997 [JP] Japan .................................... 9-002113

[51] Int. Cl.$^6$ ........................................................ B08B 5/04
[52] U.S. Cl. ............................. 118/50; 118/52; 118/319; 118/56; 134/153; 134/157
[58] Field of Search ................................ 118/50, 52, 53, 118/56, 319; 427/299, 300, 385.5, 240; 134/153, 154, 157

[56] References Cited

U.S. PATENT DOCUMENTS

| 4,838,289 | 6/1989 | Kottman et al. | 134/157 |
| 4,886,728 | 12/1989 | Salamy et al. | 427/240 |
| 5,580,607 | 12/1996 | Takekuma et al. | 118/52 |
| 5,608,943 | 3/1997 | Konishi et al. | 118/50 |
| 5,688,322 | 11/1997 | Motoda et al. | 118/56 |
| 5,762,708 | 6/1998 | Motoda et al. | 118/319 |
| 5,861,061 | 1/1999 | Hayes et al. | 118/52 |
| 5,916,631 | 6/1999 | Mahneke | 118/52 |

FOREIGN PATENT DOCUMENTS

| 58-182830 | 10/1983 | Japan . |
| 59-127836 | 7/1984 | Japan . |
| 1-214023 | 8/1989 | Japan . |
| 4-119524 | 4/1992 | Japan . |

*Primary Examiner*—Benjamin Utech
*Assistant Examiner*—Duy-Vu Deo
*Attorney, Agent, or Firm*—Young & Thompson

[57] ABSTRACT

In a resist deposition machine, an edge rinse mechanism comprising a cover covering and surrounding an exfoliating-agent discharging nozzle and having an opening formed at a position in the proximity of a peripheral edge portion of a wafer held on a vacuum chuck, and a forced-exhausting tube coupled to the cover. In an edge rinsing operation, the peripheral edge portion of the wafer is accommodated through the opening into an inside of the cover, and a resist exfoliating agent is discharged from the exfoliating-agent discharging nozzle to a peripheral portion of a resist film formed on the wafer held on the vacuum chuck, so that a dissolved resist material and the resist exfoliating agent are scattered into the inside of the cover, and forcibly exhausted from the cover through the forced-exhausting tube. Thus, it is possible to prevent the dissolved resist material and the resist exfoliating agent from adhering on a resist pattern formation zone of the resist film formed on the wafer.

3 Claims, 3 Drawing Sheets

EDGE RINSE MECHANISM FOR REMOVING A PERIPHERAL PORTION OF A RESIST FILM FORMED ON A WAFER

BACKGROUND OF THE INVENTION

1. Field of the Invention

The present invention relates to an edge rinse mechanism, and more specifically to an edge rinse mechanism for removing only a peripheral portion of a resist film formed on a whole surface of a semiconductor wafer for a semiconductor device.

2. Description of Related Art

Referring to FIG. 1, there is shown a diagrammatic vertical sectional view of a prior art edge rinse mechanism incorporated in a resist deposition machine. This edge rinse mechanism is used for removing only a peripheral portion 2b of a resist film 2 deposited on the whole of a principal surface of a semiconductor wafer 1 so that a central portion 2a of the resist film 2 remains on the principal surface of the semiconductor wafer 1. Here, the central portion 2a of the resist film 2 corresponds to a resist pattern formation zone, and the peripheral portion 2b of the resist film 2 corresponds to a zone excluding the resist pattern formation zone.

In brief, the shown resist deposition machine includes a vacuum chuck 3a for sucking and holding the wafer 1 on an upper surface thereof. This vacuum chuck 3a is fixed to a vertical rotating shaft 3b, which is driven by a motor 3c, so that the chuck 3a and hence the wafer 1 are rotated by the motor 3c. The resist deposition machine also includes a cup 4 surrounding the chuck 3a and hence the wafer 1 held on the vacuum chuck 3a, separately from the wafer 1 held on the vacuum chuck 3a, and an exfoliating-agent discharging nozzle 5 directed to discharge a resist exfoliating agent 6 toward the peripheral portion 2b of the resist film 2 formed on the wafer 1 held on the vacuum chuck 3a.

In an edge rinsing operation of the above mentioned prior art edge rinse mechanism, the resist exfoliating agent 6 is discharged from the nozzle 5 while the wafer 1 which has the resist film 2 deposited on the whole principal surface thereof and which is sucked and held with the vacuum chuck 1, is rotated together with the vacuum chuck 1, so that only the peripheral portion 2b of the resist film 2 is dissolved, and on the other hand, the dissolved resist material and the resist exfoliating agent 6 are scattered radially outward from a periphery of the wafer 1 by action of a centrifugal force generated by the rotation of the wafer 1.

In this rinsing process, the scattered resist material and the scattered resist exfoliating agent 6 collide against an inner wall of the cup 4 and are bounded by the inner wall of the cup 4 so that, as designated with Reference Numeral "2c" in FIG. 2, the resist material and the resist exfoliating agent 6 adhere on the central portion 2a of the resist film 2, namely, the resist pattern formation zone, with the result that a concaveconvex is formed on an upper surface of the resist pattern formation zone 2a, which will cause a patterning defective.

Under the above mention circumstance, Japanese Patent Application Pre-examination Publication No. JP-A-01-214023, (the content of which is incorporated by reference in its entirety into this application, and also an English abstract of JP-A-01-214023 is available from the Japanese Patent Office and the content of the English abstract of JP-A-01-214023 is also incorporated by reference in its entirety into this application) proposes to locate a cylindrical cover to cover the resist pattern formation zone 2a from a position above the wafer 1, in order to prevent the scattered resist material and the scattered resist exfoliating agent 6 from adhering on the resist pattern formation zone 2a by action of the cylindrical cover. However, this approach is disadvantageous in that the resist material and the resist exfoliating agent 6 adhere and are piled up on the cylindrical cover. In addition, a drive mechanism for displacing and positioning the cylindrical cover is located directly above the resist pattern formation zone 2a. As a result, another problem is encountered in that the deposits on the cylindrical cover and dust generated from the drive mechanism will fall down and adhere on the resist pattern formation zone 2a.

In another proposed example, an inner cup having a number of small perforations is located at an inside of the cup 4, and is rotated at a high speed, so that by action of a centrifugal force, deposits such as the resist material deposited on the inner cup are caused to be scattered outward at the same time as the deposition, with the result that the material is prevented from being bounded to the resist pattern formation zone 2a by action of the inner cup. In this second proposal, however, if the resist material deposits on the rotating inner cup, the small perforations are clogged, so that a cup exhausting pressure and a wind speed vary, with the result that it becomes difficult to ceaselessly realize a uniform film thickness.

SUMMARY OF THE INVENTION

Accordingly, it is an object of the present invention to provide an edge rinse mechanism which has overcome the above mentioned defect of the conventional one.

Another object of the present invention is to provide an edge rinse mechanism capable of preventing the scattered and bounded resist material and resist exfoliating agent from adhering on the resist pattern formation zone of the resist film formed on the wafer, thereby preventing the wafer patterning defective.

The above and other objects of the present invention are achieved in accordance with the present invention by an edge rinse mechanism provided in a resist deposition machine which includes a chuck for holding a wafer, the chuck being fixed to a vertical rotating shaft so that the wafer held on the chuck is rotated through the vertical rotating shaft, a cup surrounding the wafer held on the chuck, and an exfoliating-agent discharging nozzle directed to discharge a resist exfoliating agent toward a peripheral portion of the wafer held on the chuck, the edge rinse mechanism comprising a cover covering and surrounding the exfoliating-agent discharging nozzle and having an opening formed at a position in the proximity of a peripheral edge portion of the wafer held on the chuck so that in an edge rinsing operation, the peripheral edge portion of the wafer held on the chuck is accommodated through the opening into an inside of the cover, and when a resist exfoliating agent is discharged from the exfoliating-agent discharging nozzle to a peripheral portion of a resist film formed on the wafer held on the chuck, a dissolved resist material and the discharged resist exfoliating agent are scattered into the inside of the cover, and a forced-exhausting means coupled to the cover for collecting and exhausting the dissolved resist material and the resist exfoliating agent scattered into the inside of the cover.

In an embodiment of the edge rinse mechanism, the exfoliating-agent discharging nozzle and the cover can be preferably moved in a radial direction of the wafer while the exfoliating-agent discharging nozzle discharges the resist exfoliating agent to dissolve the peripheral portion of the resist film formed on the wafer. In addition, the forced-exhausting means is preferably configured to on-off control the forced-exhausting and also to control an exhausting pressure of the forced-exhausting.

With the above mentioned arrangement, even if the dissolved resist material and the resist exfoliating agent scattered in the edge rinsing operation are bounded within the cover, most of the bounded resist material and resist exfoliating agent adhere on an inner wall surface of the cover. In addition, since the forced-exhausting means forcibly exhausts most of the scattered resist material and resist exfoliating agent, the amount of deposition on the inner wall surface of the cover can be minimized. Therefore, it is possible to minimize or prevent the scattered resist material and resist exfoliating agent from adhering on the resist pattern formation zone remaining on the wafer. In addition, since the cover is located in the proximity of the periphery of the wafer, radially outward separated from the periphery of the wafer, it is possible to minimize the dust falling down from the cover onto the resist pattern formation zone.

The above and other objects, features and advantages of the present invention will be apparent from the following description of a preferred embodiment of the invention with reference to the accompanying drawings.

DESCRIPTION OF THE PREFERRED EMBODIMENT

Figure 2:
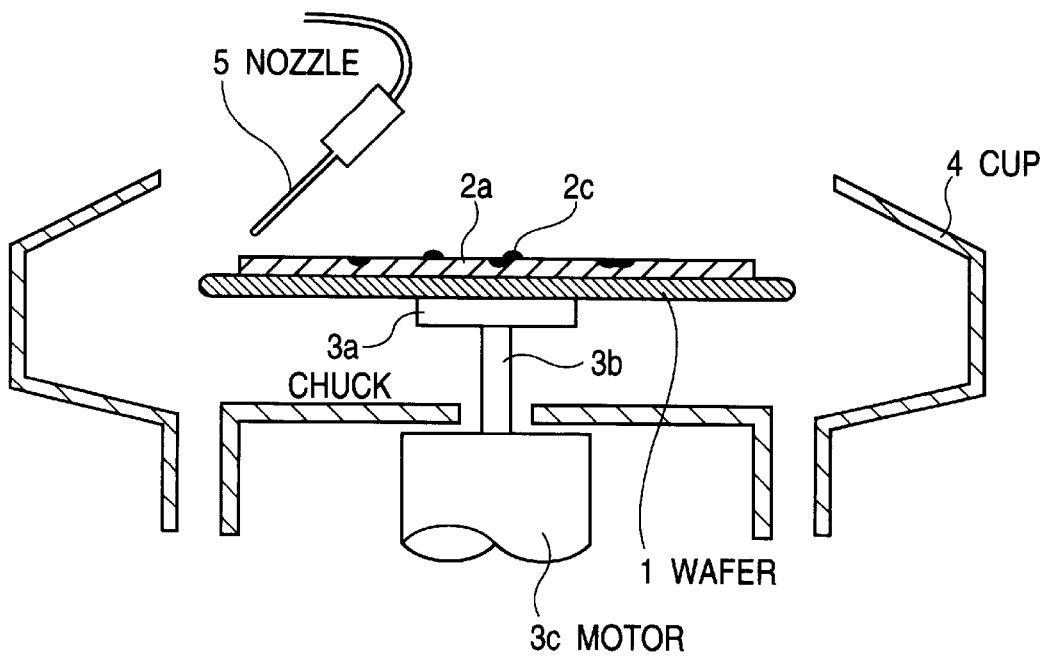
Figure 3:
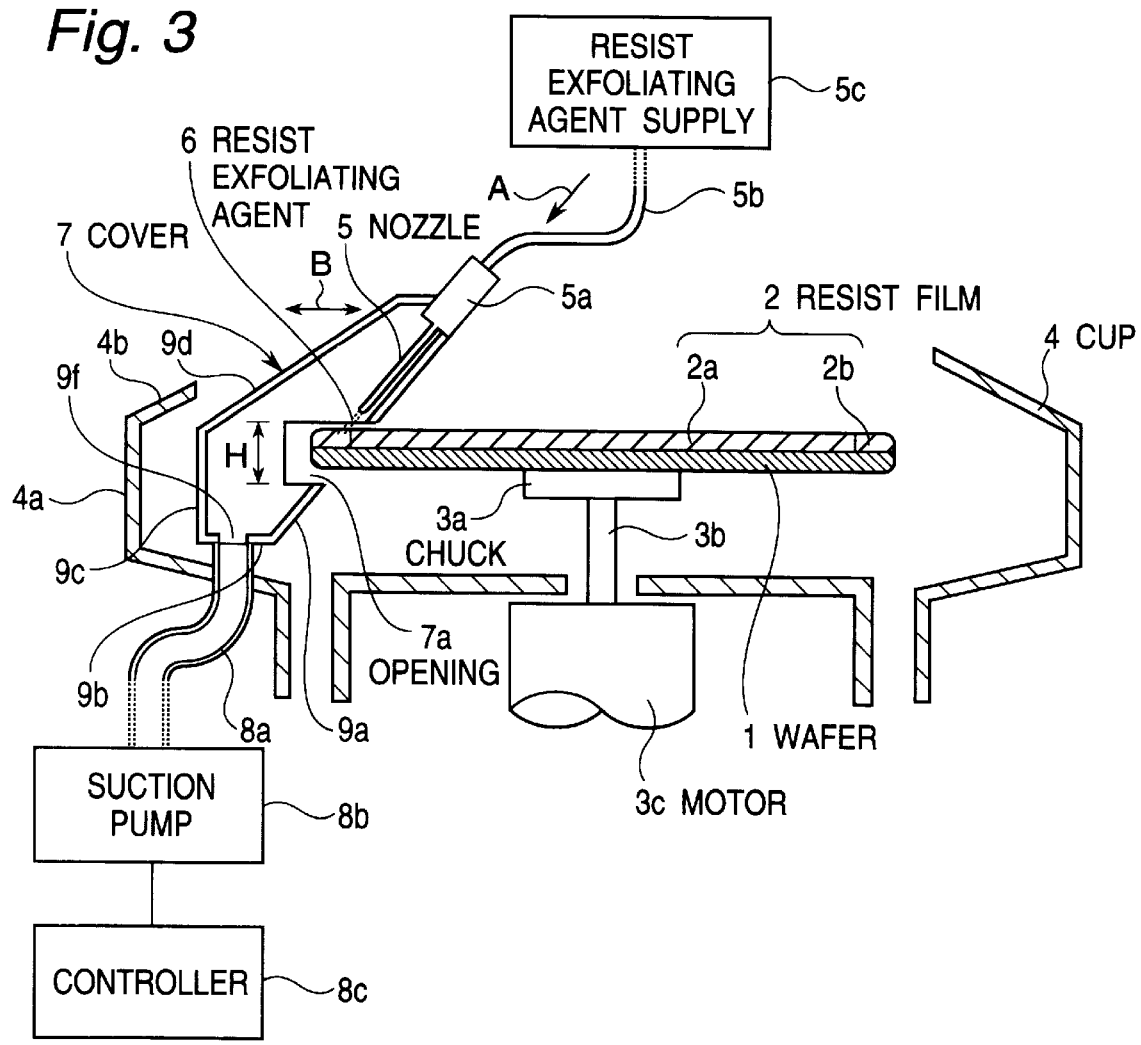
FIG. 3 is a diagrammatic vertical sectional view of an embodiment of the edge rinse mechanism in accordance with the present invention, incorporated in a resist deposition machine.

Referring to FIG. 3, there is shown a diagrammatic vertical sectional view of an embodiment of the edge rinse mechanism in accordance with the present invention. In FIG. 3 and in FIGS. 4 and 5 which will be described hereinafter, elements corresponding to those shown in FIGS. 1 and 2 are given the same Reference Numerals, and explanation thereof will be omitted for simplification of the description.

Figure 1:
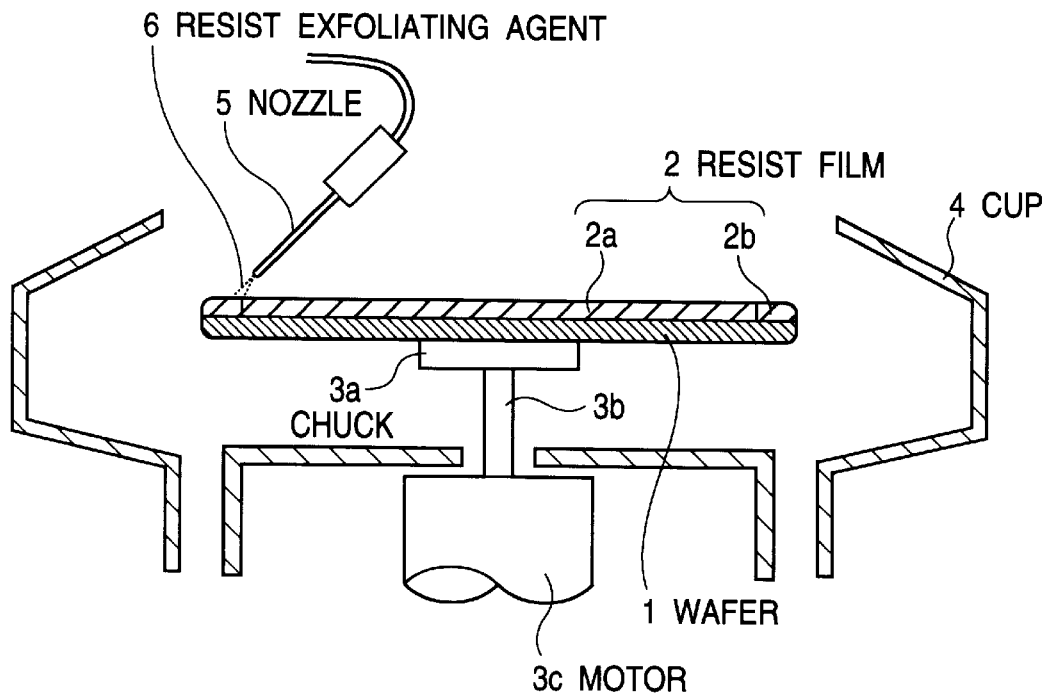
FIGS. 1 and 2 are diagrammatic vertical sectional views of a prior art edge rinse mechanism incorporated in a resist deposition machine.

As seen from comparison between FIGS. 1 and 3, the shown embodiment of the edge rinse mechanism in accordance with the present invention includes a cover 7 surrounding and covering the exfoliating-agent discharging nozzle 5. This cover 7 is fixed at its upper portion to a base 5a of the nozzle 5, and has an opening 7a horizontally opened at a position in the proximity of a peripheral edge of the wafer 1 held on the vacuum chuck 3a and at substantially the same level as that of the wafer 1. A bottom of the cover 7 is coupled to an exhausting tube 8a, which is also coupled to a suction pump 8b controlled by a controller 8c. This suction pump 8b is preferably configured to be able to change an exhaust pressure in the range of 0 to 30 mmHg. On the other hand, the exfoliating-agent discharging nozzle 5 is coupled through a supply tube 5b to a resist exfoliating agent supply 5c.

In use, the exfoliating-agent discharging nozzle 5 is positioned to discharge the resist exfoliating agent 6 toward the peripheral portion 2b of the resist film 2 formed on the wafer 1 in an obliquely downward and radially outward direction "A" as shown in FIG. 3, in order to cause the dissolved resist material and the discharged resist exfoliating agent 6 to be directed in a radially outward direction of the wafer 1, to enter through the opening 7a into the inside of the cover 7.

Figure 3A:
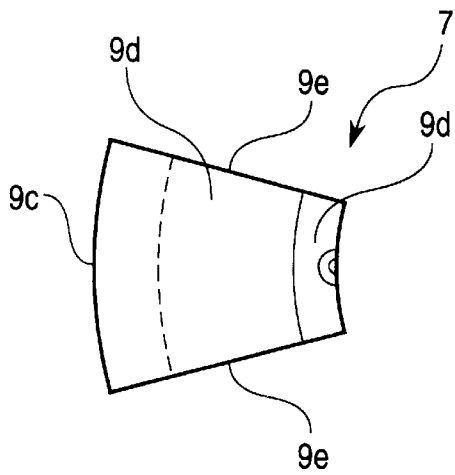
FIG. 3A is a diagrammatic top view of the cover shown in FIG. 3, but in a condition that the cover is dismounted from the exfoliating-agent discharging nozzle.
Figure 3B:
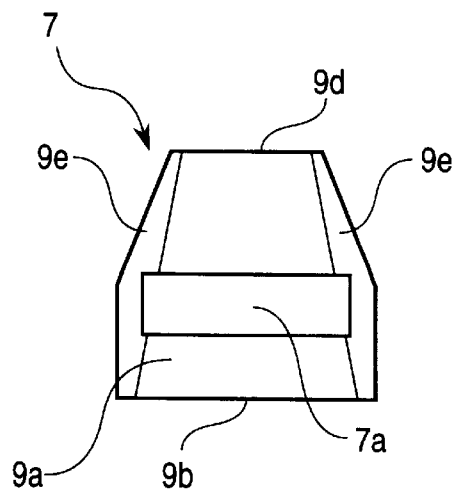
FIG. 3B is a diagrammatic side view of the cover shown in FIG. 3, viewed from a center of the cup, but in a condition that the cover is dismounted from the exfoliating-agent discharging nozzle.

Referring to FIG. 3, 3A and 3B, the cover 7 has an inclined inner wall 9a extending substantially in parallel to the resist exfoliating agent discharge direction "A", a bottom wall 9b extending radially outwardly from a lower end of the inclined inner wall 9a, a vertical outer wall 9c extending vertically upwardly from an radially outer end of the bottom wall 9b, substantially in parallel to a vertical wall 4a of the cup 4, an inclined outer wall 9d extending from an upper end of the vertical outer wall 9c to an upper end of the inclined inner wall 9a, substantially in parallel to an inward collar 4b which extends from an upper end of the vertical wall 4a of the cup 4 in an obliquely upward and radially inward direction, and a pair of side walls 9e. Therefore, in the vertical sectional view shape shown in FIG. 3, the vertical outer wall 9c and the inclined outer wall 9d are complementary to the vertical wall 4a and the inward collar 4b of the cup 4.

In addition, an assembly composed of the nozzle 5 and the cover 7 is configured to displace in a radial direction "B" of the wafer 1.

The opening 7a is formed in the inclined inner wall 9a to extend horizontally and to be opened at a position in the proximity of the peripheral edge of the wafer 1 held on the vacuum chuck 3a, and the opening 7a has a vertical height "H" slightly larger than a total thickness of the wafer 1 having a resist film 2 deposited on a principal surface thereof. Therefore, the peripheral edge of the wafer 1 held on the vacuum chuck 3a can be accommodated through the opening 7a into the inside of the cover 7, while maintaining a gap between a peripheral edge of the opening 7a and a surface of the wafer 1 having a resist film 2 deposited thereon, at a possible minimum extent. The exhausting tube 8a is coupled to a hole 9f formed in the bottom wall 9b of the cover 7. Therefore, the cover 7 confines a substantial closed space which is opened only through the opening 7a and the hole 9f. The exfoliating-agent discharging nozzle 5 is located in the inside of the cover 7 in such a manner that the base 5a is mounted on an upper portion of the inclined inner wall 9a and the nozzle 5 extends along an inner surface of the inclined inner wall 9a so that a tip end of the nozzle 5 is positioned in the proximity of the opening 7a.

Now, an operation of the edge rinse mechanism will be described with reference to FIGS. 3, 4 and 5.

Figure 4:
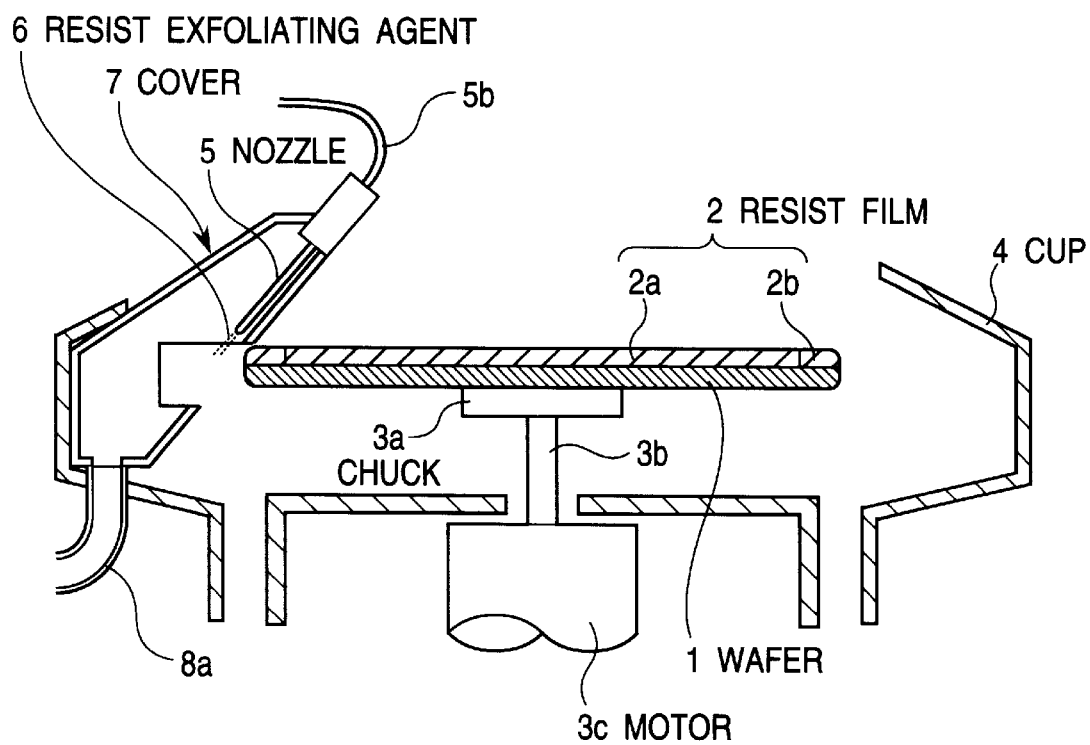
FIGS. 4 and 5 are diagrammatic vertical sectional views of the embodiment of the edge rinse mechanism shown in FIG. 3, in conditions respectively different from that shown in FIG. 3, but the resist exfoliating agent supply and the exhausting mechanism associated to the cover being omitted for simplification of the drawings.

FIG. 4 illustrates an initial condition of the edge rinsing operation. In the initial condition shown in FIG. 4, the wafer 1 sucked and held on the vacuum chuck 3 and having the resist film 2 formed on the principal surface thereof is rotated by the rotating motor 3c, and on the other hand, the assembly composed of the cover 7 and the nozzle 5 is positioned at a radially outermost position in which the vertical outer wall 9c and the inclined outer wall 9d are in contact with or very close to the vertical wall 4a and the inward collar 4b of the cup 4, respectively, and the tip end of the nozzle 5 is positioned at a position radially outward separated from a peripheral edge of the wafer 1. Therefore, the resist exfoliating agent 6 discharged from the nozzle 5 is forcibly exhausted from the cover 7 through the exhausting tube 8a, without colliding with the resist film 2.

The assembly composed of the nozzle 5 and the cover 7 is gradually displaced from the initial position shown in FIG. 4 radially inward to a position shown in FIG. 3 by a distance of for example 20 mm at maximum, while discharging the resist exfoliating agent 6 from the nozzle 5. Therefore, the peripheral portion 2b of the resist film 2 is dissolved and scattered gradually from an outer edge of the resist film 2 in this radially inward displacement of the assembly composed of the nozzle 5 and the cover 7. The scattered dissolved resist material and the resist exfoliating agent 6 are directed into the inside of the cover 7, since the peripheral edge of the wafer 1 has been already accommodated through the opening 7a into the inside of the cover 7. Accordingly, even if the scattered resist material and the resist exfoliating agent 6 are bounded by an inner surface of the cover 7, the dissolved resist material and the resist exfoliating agent 6 are prevented from going out of the cover 7 by the cover 7 because the gap between the peripheral edge of the opening 7a and the surface of the wafer 1 having the resist film 2 deposited thereon is at a possible minimum extent. Thus, the dissolved resist material and the resist exfoliating agent 6 are prevented from adhering on the resist pattern formation zone 2a. On the other hand, the dissolved resist material and the resist exfoliating agent 6 in the cover 7 are forcibly exhausted through the exhausting tube 8a by the suction pump 8b.

Since the suction pump 8b is controlled by the controller 8c not only to on-off control the exhausting but also to control the exhausting pressure, it is possible to realize an optimum exhausting sequence and an optimum exhausting pressure, which are able to prevent the removed resist material and the resist exfoliating agent 6 from being bounded to the resist pattern formation zone 2a of the resist film 2 while maintaining the film thickness of the resist pattern formation zone 2a at an optimum value.

Figure 5:
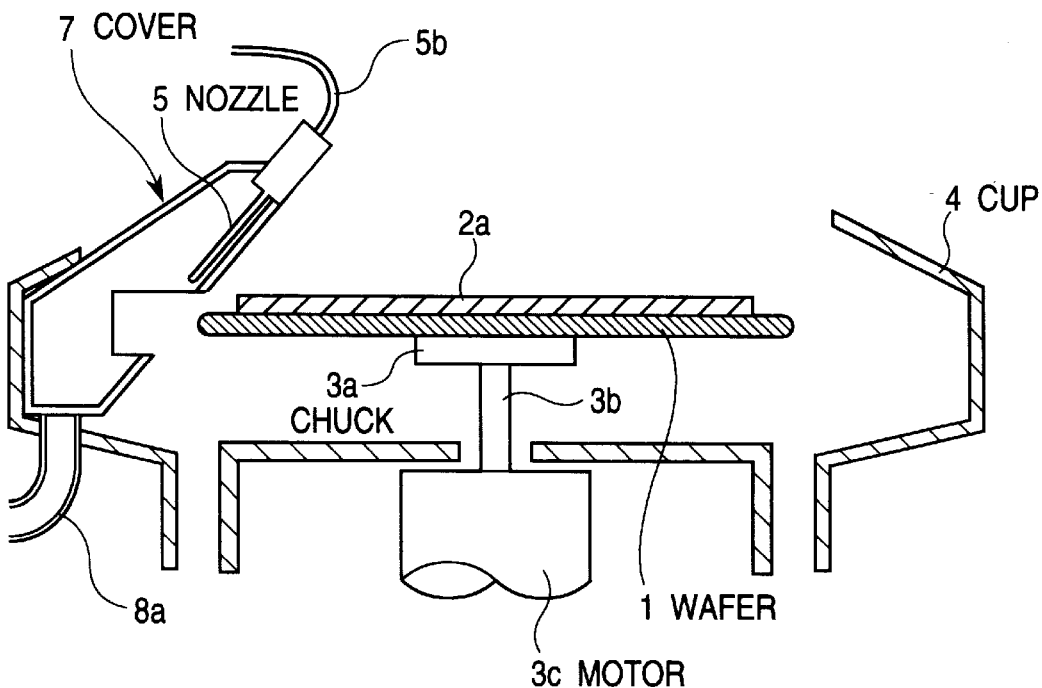

FIG. 5 is a diagrammatic vertical sectional view of the embodiment of the edge rinse mechanism for illustrating a final condition of the edge rinsing operation. As shown in FIG. 5, after the edge rinsing operation is completed, the assembly composed of the nozzle 5 and the cover 7 is returned to a position similar to the initial position shown in FIG. 4.

With the above mentioned arrangement, it is possible to prevent the removed resist material and the resist exfoliating agent from adhering on the resist pattern formation zone of the resist film by the bounding of those materials. As a result, the inventor succeeded in reducing the patterning defective to not greater than 20% of the defective percentage in the prior art. The reason for this is that, since the cover coupled to the exhausting tube is provided to substantially completely surround the exfoliating-agent discharging nozzle, the bounded resist material and resist exfoliating agent will adhere on an inner surface of the cover and are forcibly exhausted through the exhausting tube.

In addition, since the exhausting pressure can be controlled, it is possible to prevent change of the film thickness and the film quality by optimizing the exhausting pressure.

The invention has thus been shown and described with reference to the specific embodiments. However, it should be noted that the present invention is in no way limited to the details of the illustrated structures but changes and modifications may be made within the scope of the appended claims.

I claim:

1. In a resist deposition machine which includes a chuck for holding a wafer, the chuck being fixed to a vertical rotating shaft so that the wafer held on the chuck is rotated through the vertical rotating shaft, a cup surrounding the wafer held on the chuck, and an exfoliating-agent discharging nozzle directed to discharge a resist exfoliating agent toward a peripheral portion of the wafer held on the chuck, the edge rinse mechanism comprising a cover covering and surrounding the exfoliating-agent discharging nozzle and having an opening formed at a position in the proximity of a peripheral edge portion of the wafer held on the chuck so that in an edge rinsing operation, the peripheral edge portion of the wafer held on the chuck is accommodated through the opening into an inside of the cover, and when a resist exfoliating agent discharged from the exfoliating-agent discharging nozzle to a peripheral portion of a resist film formed on the wafer held on the chuck, a dissolved resist material and the resist exfoliating agent are scattered into the inside of the cover, and a forced-exhausting means coupled to the cover for collecting and exhausting the dissolved resist material and the resist exfoliating agent scattered into the inside of the cover.

2. A edge rinse mechanism claimed in claim 1 wherein the exfoliating-agent discharging nozzle and the cover are constituted to be moved in a radial direction of the wafer while discharging the resist exfoliating agent from the exfoliating-agent discharging nozzle to dissolve the peripheral portion of the resist film formed on the wafer.

3. A edge rinse mechanism claimed in claim 1 wherein the forced-exhausting means is configured to on-off control the forced-exhausting and also to control an exhausting pressure of the forced-exhausting.

* * * * *